(12) United States Patent
Parnas

(10) Patent No.: US 6,978,410 B1
(45) Date of Patent: Dec. 20, 2005

(54) TEST LANGUAGE CONVERSION METHOD

(75) Inventor: Bruce R. Parnas, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 310 days.

(21) Appl. No.: 10/089,137

(22) PCT Filed: Sep. 23, 2000

(86) PCT No.: PCT/US00/26189

§ 371 (c)(1),
(2), (4) Date: Jul. 8, 2002

(87) PCT Pub. No.: WO01/23900

PCT Pub. Date: Apr. 5, 2001

Related U.S. Application Data

(60) Provisional application No. 60/156,121, filed on Sep. 25, 1999.

(51) Int. Cl.⁷ ............................................. G01R 31/28
(52) U.S. Cl. ..................................... 714/724; 714/738
(58) Field of Search ............................... 714/724, 725, 714/738, 38, 718; 324/73.1, 765, 158.1

(56) References Cited

U.S. PATENT DOCUMENTS

| | | | |
|---|---|---|---|
| 5,778,004 A | 7/1998 | Jennion et al. | |
| 5,845,234 A | 12/1998 | Testa et al. | |
| 5,974,241 A | 10/1999 | Fusco | |
| 6,067,652 A | 5/2000 | Fusco et al. | |
| 6,553,529 B1 * | 4/2003 | Reichert | 714/738 |

* cited by examiner

Primary Examiner—Albert Decady
Assistant Examiner—James C Kerveros
(74) Attorney, Agent, or Firm—Muramatsu & Associates

(57) ABSTRACT

A method of converting test vectors in an original cycle based test language into a target cycle based test language, by forming a set of templates depicting waveforms defined in the target test language, decomposing a waveform in the original test language into a set of constituent events where each event includes data showing at least a starting value and a number of subsequent edges of the waveform, comparing the template and the set of constituent events at different levels of abstraction determined in advance, in the order of a signal level, a wave kind level where the signal is configured by a plurality of wave kinds, and a character level where the wave kind is configured by a plurality of characters, and storing the waveform data in the target test language when a match is detected and retrieving corresponding parameters of the waveform in the original test language.

7 Claims, 15 Drawing Sheets

Fig. 1
Example of STIL(1)

Signals:
```
Signals {
    Signal[0] InOut;
    Signal[1] InOut;
    Signal[2] InOut;
}

SignalGroups {
    signal = 'Signal[0..2]';
}
```

Fig. 2
Example of STIL(2)

```
Timing:
Timing T1
{
    WaveformTable wft1
    {
        Period '1us';
        Waveforms
        {
            Signal[0] {01 { '400ns' D/U; }}
            Signal[1] {01 { '400ns' D/U; '500ns' D;}}
            23 { '0ns' U/D; '200ns' D/U; '600ns' U/D;}}
            Signal[2] {01 { '200ns' D/U; }
            23 {'100ns' D/U; '400ns' D; }}
        } // end of Waveforms block
    } // End of WaveformTable wft1
} // End of Timing block
```

Fig. 3
Example of STIL(3)

Pattern:
Pattern pat1 {

W wft1;

V { signal =011; } // Note: signal = Signal[0] +
   V { signal =020; } // Signal[1] + Signal[2]
   V { signal =111; }
   V { signal =103; }
   V { signal =132; }
   V { signal =000; }
   V { signal =003; }

}

Fig. 4
Example of STIL(4)

Flow:
```
PatternBurst pb1 {
    PatList {
        pat1;
    } // end of PatList
} // end of PatternBurst PatternExec {
    Timing T1;
    PatternBurst pb1;
} // end of PatternExec
```

Fig. 5
Example of TDL

Timing and Pattern:
SIGNAL signal_1;
signal_1.drekind( 0, NRZ);
signal_1.wavekind( 1, RZO);
signal_1.timing( 1, T1, 400.0nS);
signal_1.timing( 1, T2, 500.0nS);
signal_1.wavekind( 2, XOR);
signal_1.timing( 2, T3, 0.0nS);
signal_1.timing( 2, T1, 200.0nS);
signal_1.timing( 2, T2, 600.0nS);
signal_1.wavekind( 3, NRZ);
signal_1.wavekind( 4, NRZ);
signal_1.timing( 4, STBL, 0.0nS);
signal_1.timing( 4, DREL, 0.0nS);

Conversion Basics

- Vector-based to vector-based conversion

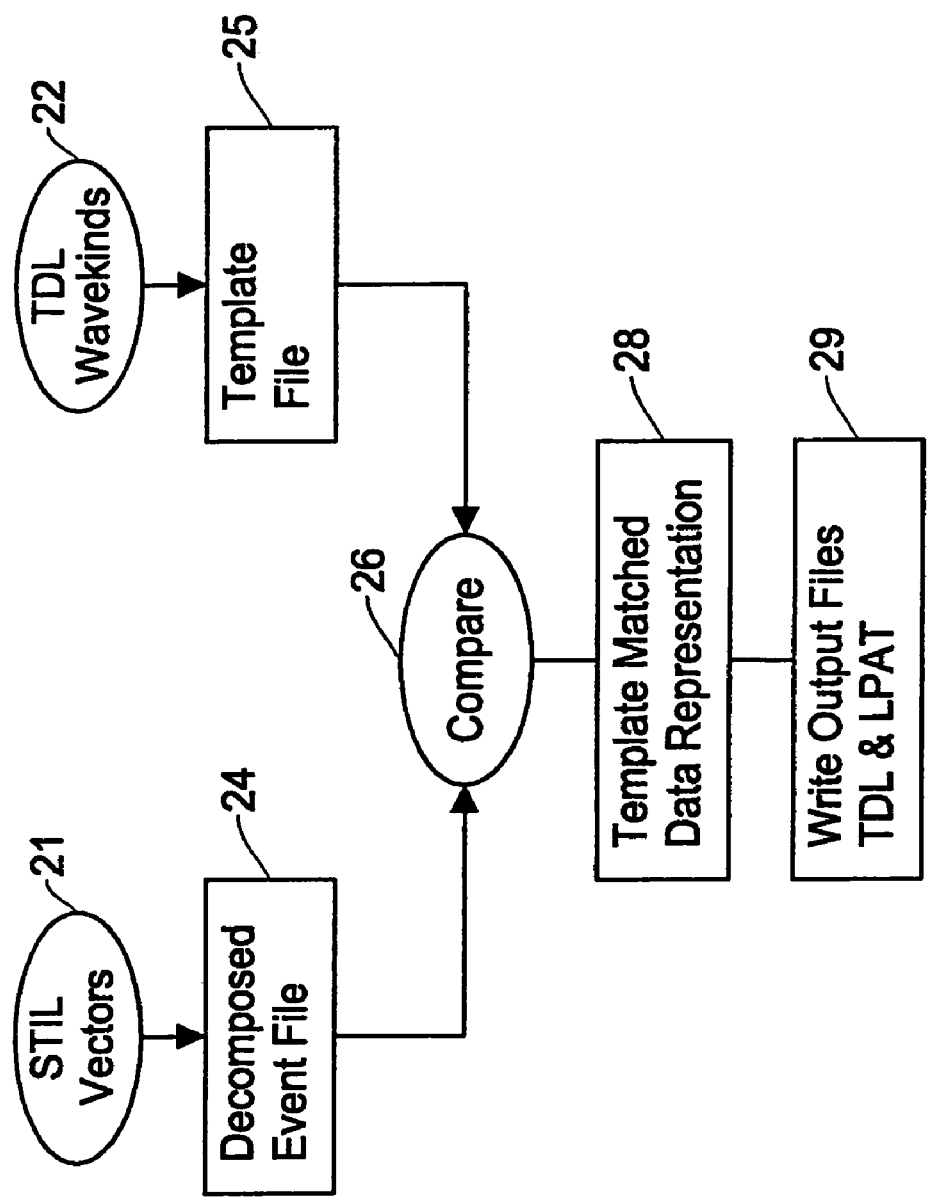

Fig. 7
Template Matching

- 01 {'400ns' D/U;} => NRZ; T1 = 400ns; T2 = 400ns

- Template

{0,0,0}
{0,1,1 T2}
{1,0,1 T1}
{1,1,0}

Wavekind Matching (1)

Fig. 9
Wavekind Matching (2)
NRZ; RZO...
XOR; T3=100ns; T1=200ns; T2=400ns
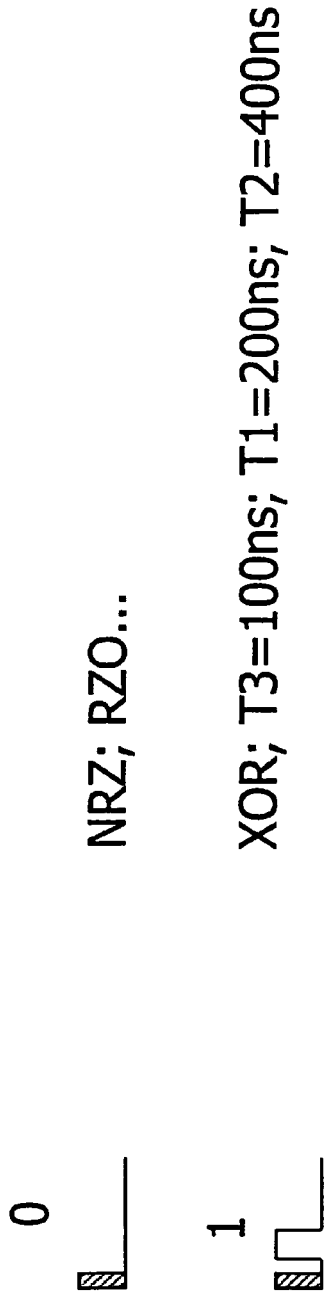
- Analyze timing block
  - What if no waveform can end in 'U' state?
RZO; T1=200ns; T2=400ns

Fig. 10A

| Number of Edges | Start Value | |
|---|---|---|
| | 0 | 1 |
| 0 | T | T |
| 1 | F | T |
| 2 | T | F |
| 3 | F | F |
| 4 | F | F |

| Number of Edges | Start Value | |
|---|---|---|
| | 0 | 1 |
| 0 | T | T |
| 1 | F | T |
| 2 | T | F |
| 3 | F | F |
| 4 | F | F |

23{'100ns' D; '200ns' D/U; '400ns'D;}

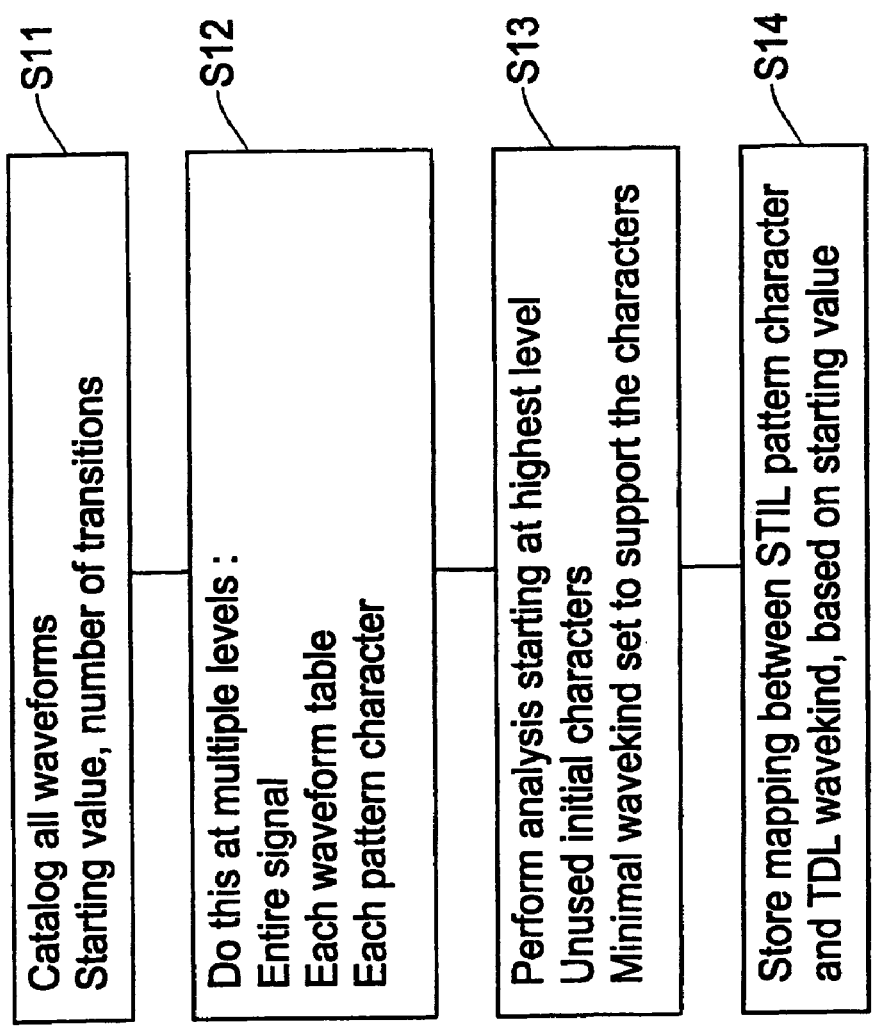

Multi-Clock (MCLK)

- MCLK
  - Find repetitive basic timing unit in STIL pattern char
  - Can be based on single- or double-pulse waveform

- Determine number of repetitions and factor into Rate

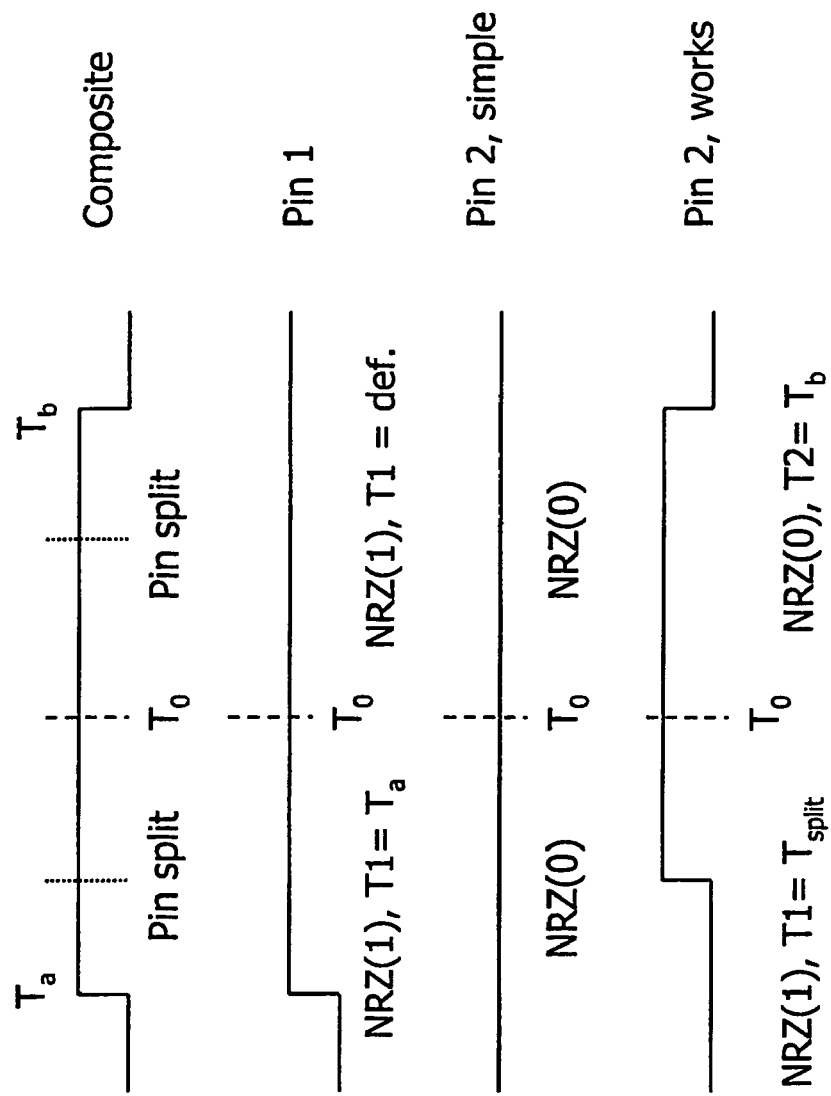

TEST LANGUAGE CONVERSION METHOD

This application claims benefit of Provisional Application No. 60/156,121, filed Sep. 25, 1999.

FIELD OF THE INVENTION

This invention relates to a test data conversion method for testing semiconductor devices by automatic test equipment, and more particularly, to a method of converting digital test vectors written in STIL (Standard Test Interface Language) to digital test vectors of a test language unique to the automatic test equipment.

BACKGROUND OF THE INVENTION

In testing semiconductor devices such as ICs and LSIs by automatic test equipment (ATE) or an IC tester, a semiconductor IC device to be tested is provided with test signals or test patterns produced by an IC tester at its appropriate pins at predetermined test timings. The IC tester receives output signals from the IC device under test in response to the test signals. The output signals are strobed or sampled by strobe signals generated by the IC tester with predetermined timings to be compared with expected data to determine whether the IC device functions correctly or not. Typically, timings of the test signals and strobe signals are defined relative to a start timing of each test cycle of IC tester.

As noted above, an IC tester generates test patterns and strobes, i.e., test vector, based on digital test vector data described in a language (format) unique to the tester. Such languages for automatic test equipment are different from manufacturer to manufacturer.

Recently, IEEE has proposed a test language STIL (Standard Test Interface Language) as a standard test interface language (IEEE Std 1450-1999). STIL provides an interface between computer-aided engineering (CAE) such as a logic test simulator and automatic test equipment. In a CAE environment or an EDA (electronic design automation) environment, a semiconductor device is designed with the aid of computer system and such design is tested through a logic test simulator or a testbench. It is preferable to utilize the digital test vectors resulted from the logic simulation in testing actual semiconductor devices by IC testers. STIL is designed to facilitate the transfer of large volumes of digital test vectors from CAE environment to the automatic test equipment (ATE) environment.

The STIL test language has recently become a standard. At present, however, most ATE systems do not use STIL as a native language. Such native languages provided by test equipment manufacturers are not compatible to one another. Accordingly, there is a need to effectively convert STIL to the ATE native language.

SUMMARY OF THE INVENTION

It is, therefore, an object of the present invention to provide a method of converting digital test vectors of one cycle based test language to another cycle based test language with high efficiency and accuracy.

It is another object of the present invention to provide a test language conversion method of converting test vectors in a STIL (Standard Test Interface Language) format into a target format with high efficiency and accuracy.

In the present invention, the method of converting test vectors in an original cycle based test language into a target cycle based test language, comprising the following steps of: reading available waveforms defined in the target test language and forming a set of templates depicting the waveforms where each template corresponds to a waveform of the target test language and includes data showing at least a starting value of a segment of waveform and a number of subsequent edges in the waveform; reading the test vectors of the original test language and decomposing a waveform in the test vectors in the original test language into a set of constituent events where each event includes data showing at least a starting value and a number of subsequent edges of the waveform; comparing the template derived from the waveform in the target test language and the set of events derived from the original test language; storing the waveform data in the target test language when a match is detected in the comparison step and retrieving corresponding parameters of the waveform in the test vectors of original test language and storing the parameters in combination with the matched waveform data; and repeating the above steps for all of the test vectors in the original test language, thereby forming a test vector file of the target test language.

Typically, the original test language is STIL (Standard Test Interface Language) specified by IEEE Std 1450-1999. Preferably, the step of comparing the template and the set of events includes a step of changing different levels of test vectors, in the order of a signal level, a wavekind level where the signal is configured by a plurality of wavekinds, a character level where the wavekind is configured by a plurality of characters.

The set of events derived from the original test language is stored in a table format having columns assigned to the data showing the number of subsequent edges and the starting value. The table storing the set of events is optimized by studying the starting value of a particular event based on an ending state produced by the previous event, thereby simplifying the data in the table.

BRIEF DESCRIPTION OF THE DRAWINGS

FIG. 1 is a diagram showing an example of format in STIL which describes signals or signal groups in the digital test vectors which constitute intended test vectors.

FIG. 2 is a diagram showing an example of format in STIL which describes timings of edge in each of the signals constituting the waveforms.

FIG. 3 is a diagram showing an example of format in STIL which describes patterns of vectors in each of the signals constituting the waveforms.

FIG. 4 is a diagram showing an example of format in STIL which describes a flow of patterns in the test vectors constituting the intended waveforms.

FIG. 5 is a diagram showing an example of format in TDL (Test Description Language) which is a test language native to ATE system developed by the assignee of this invention.

FIG. 6B is a schematic diagram showing an example of functional configuration in the test language conversion of the present invention.

FIG. 7 is a diagram showing an example of STIL construct and an equivalent TDL representation, and a template of waveform based on the TDL representation.

FIG. 9 is a diagram showing further examples of STIL constructs, waveforms corresponding to the STIL constructs, and the TDL representations for explaining the optimization waveforms.

FIGS. 10A and 10B are tables showing examples of array depicting starting values and number of edges which represent decomposed events in the STIL test vectors for conducting the pattern match of the present invention.

FIG. 11 is a flow diagram showing an example of procedure in the wavekind matching of the present invention in the different levels of test vectors.

FIG. 14 is a waveform diagram showing a basic idea of converting the STIL test vectors to the pin multiplexing test vectors of TDL.

DETAILED DESCRIPTIONS OF THE PREFERRED EMBODIMENTS

The STIL (Standard Test Interface Language) testing language defines pattern and timing information for device testing using a cycle-based representation. The format used does not represent the language of any ATE systems, but has been constructed to provide the maximum flexibility in designing test programs. STIL has only recently been adopted as a standard and is not yet in widespread use. A number of STIL-based applications have been proposed in recent years, including general test flow, scan test methodology and ATPG (automatic test pattern generator). Currently, most ATE systems do not use STIL as a native language. Consequently, there is a need to convert from STIL to the native language of the target ATE system. This language is usually cycle-based, so the conversion is from one cycle-based representation to another.

In this patent specification, the inventor discloses some of the basic steps involved in conversion method from one cycle-based format to another cycle-based format. The inventor also presents some tricks that allow the conversion of STIL in an efficient manner. The conversions shown in this invention are based on an analysis of the data presented in STIL. As a sample target language, Test Description Language (TDL) developed by Advantest Corporation, Tokyo, Japan, an assignee of this invention, is used for illustration purposes although the principles presented are general and thus equally applicable to other test languages.

FIGS. 1–4 show examples of format in STIL for describing the digital test vectors. FIG. 1 shows formats of signals and signal groups, FIG. 2 shows formats of timings of edges in each signal. FIG. 3 shows an example of STIL format describing patterns of test vectors, and FIG. 4 shows an example of STIL format describing the flow of patterns. FIG. 5 is a diagram showing an example of format in TDL which is a target test language.

Template Matching

The conversion from one cycle-based representation to another is most easily accomplished using an event based intermediate format. Here, event is any change such as edges in test vectors or no changes defined relative to timing. The two cycle-based descriptions will usually be substantially different from one another. For converting one cycle-based description to another cycle-based description, an intervening event-based representation is used to decompose the data to basic building blocks. Namely, the input cycle-based format (STIL) is decomposed into constituent events and these events are reconstructed in the target description format (TDL).

Figure 6A:
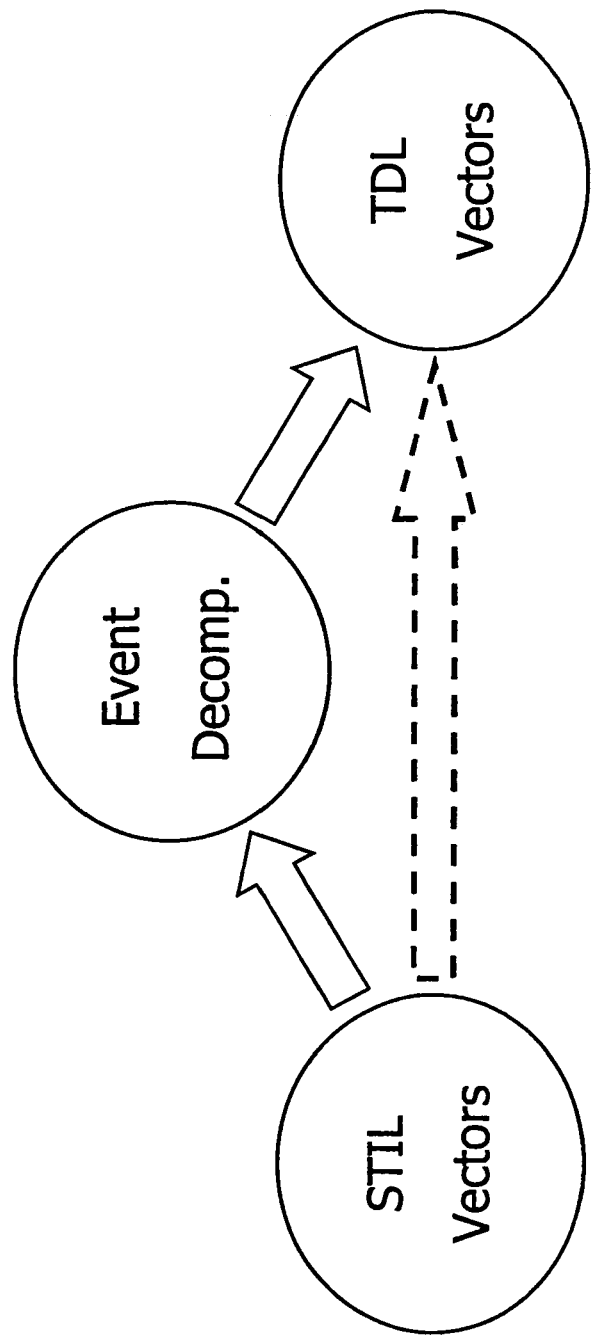
FIG. 6A is a schematic diagram showing a basic principle of test language conversion in accordance with the present invention.

This basic process is illustrated in FIG. 6A which performs the vector-based to vector-based conversion process. In the present invention, the test vectors in the STIL format is decomposed into each event which is compared with templates produced based on waveforms defined in TDL, an example of target test language. This concept is shown by the arrows of dotted lines in FIG. 6A. When match is found for a template, the matched template is listed in a file to which the parameters in the corresponding STIL test vectors are transferred to complete the waveform. In this manner, the TDL test vectors are created as shown by the arrow of dotted line in FIG. 6A.

FIG. 6B is a functional representation of the test vector conversion of the present invention from the STIL test language to the TDL test language. An STIL vector file 21 is a file storing STIL test vectors to be converted to TDL vectors through the conversion process of the present invention. Typically, the STIL test vectors in the STIL file 21 are derived from the design stage of semiconductor devices, i.e., CAE (Computer-Aided Engineering) environment or EDA (Electronics Design Automation) environment as a result of conducting logic simulation. The STIL test vectors are decomposed into constituent events and stored in a decomposed event file 24.

As noted above, TDL is a test language developed by Advantest Corporation, the assignee of the present invention, to establish a logic test pattern (LPAT) file. The format of TDL is stored in a. TDL wavekind file 22. Each waveform defined in the target test language TDL is converted to a corresponding template having a set of components. Such templates of waveforms are stored in a template file 25.

A pattern matching is performed by a comparator 26 between the events from the event file 24 and the templates from the template file 25. When match is found, the waveform corresponding to TDL is listed in a file 28 which stores template matched data representation. Further, the details of parameters for the vectors of the matched template are transferred from the STIL vectors to the TDL vectors. Such details of the vectors include timings, pattern characters, and types of edge. Thus, in a TDL & LPAT file 29, the TDL test vectors corresponding to the STIL test vectors are created through the conversion process in the foregoing.

Figure 8:
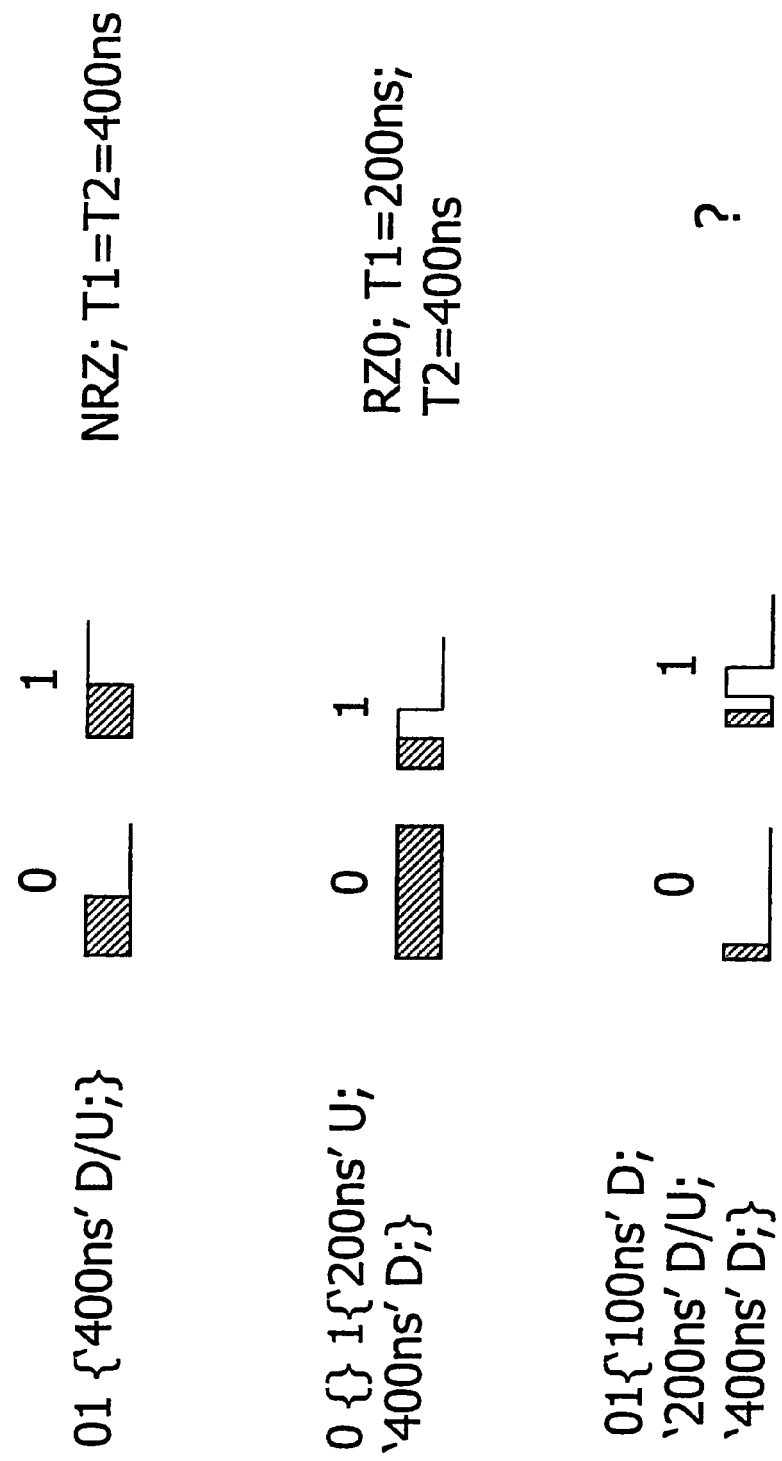
FIG. 8 is a diagram showing other examples of STIL constructs, waveforms corresponding to the STIL constructs, and the TDL representations.

As an example, with reference to FIGS. 7 and 8, consider the following STIL construct, an equivalent TDL representation and the corresponding waveforms:

01{'400 ns' D/U;}=>NRZ; T1=400 ns; T2=400 ns where the STIL construct 01 {'400 ns' D/U;} in the left means that the character '0' specifies a falling edge (D) at 400 ns while the character '1' specifies a rising edge (U) at 400 ns. This STIL representation corresponds to the waveforms shown in the upper part of FIG. 8 and to a non-return zero (NRZ) waveform defined in TDL. In FIG. 8, the waveform of character '0' shows the shaded portion from the start edge of a test cycle to the falling edge T1 at 400 ns from the start edge. The shaded portion means that the logic state in this area is undefined. Thus, the character '0' defines the falling edge T1 at 400 ns from the start of the test cycle whatever the current logic status is. Similarly, the waveform of the character '1' defines the rising edge T1 at 400 ns from the start of the test cycle whatever the current logic status is. As noted above, this example of STIL construct corresponds to the NRZ waveform of TDL.

Therefore, in the conversion method of the present invention, the construction of TDL waveforms from the decomposed STIL waveform descriptions is carried out using a template matching method. The waveforms available for a given tester are read in at run time and stored in a manner that makes template matching easy. Thus, as a first step, a list of templates is established for each waveform such as NRZ defined in TDL. The template is characterized by the set of {pattern character, starting value, number of subsequent edges} pairs that describe the waveform. The representation of the NRZ waveform in the above example is shown in the lower part of FIG. 7.

In the example of template in FIG. 7, the first element on each line is the pattern character while the next two elements represent the {starting value, number of subsequent edges} pairs while the remaining entries indicate the names for the specified edges. Using this, the example above can be represented using the NRZ waveform with the following values:

01=>{0,0,0}, {0,1,1 400 ns D}, {1,0,1 400 ns U}, {1,1,0,} where the {pattern character, starting value, number of subsequent edges} are shown. Storage of all waveforms defined in the target test language, in this example TDL, in this manner allows a simple comparison of the decomposed STIL waveforms against the capabilities of a given waveform. Thus, the library of templates is prepared in the template file 25 of FIG. 6B.

In the comparison, the decomposed STIL waveform and the template of TDL are compared with one another. The STIL waveform is decomposed into each event which is expressed by a combination of starting value and number of edges. The data describing the starting value and number of edges of each event in the STIL waveform is stored in the event file 24 of FIG. 6B. Thus, the comparison between the decomposed events and the template is made by comparing the starting value and the number of edges. This is done as a query against the waveforms, essentially asking, "can you support this many edges with this starting value?".

It should be noted that the mapping of an STIL waveform to a template requires matching all of the resulting triples that comprise the waveform. In the example above, the characters '01' from STIL result in the four triples shown in the template of FIG. 7. All four of these must be mapped in order for these characters to be fully represented. For this example, the NRZ is capable of supporting all of the required triples.

As another example of basic template matching, consider the following STIL characters, TDL representation and waveforms with reference to FIG. 8:

0{ }1{'200 ns' U; '400 ns' D;}=>RZ; T1=200 ns; T2=400 ns;

which corresponds to a return zero (RZ) waveform in TDL the waveforms of which are shown in the center of FIG. 8. Thus, the template of RZ waveform of TDL is set in the template file 25 of FIG. 6B.

The template matching examples shown in the preceding section are very simple. They match directly with standard waveforms, NRZ and RZ. These waveforms may be used on the test equipment running with TDL without any resource penalty. However, in the real test implementation, more complex waveforms are also used. Consider the following example:

01{'100 ns' D; '200 ns' D/U; '400 ns'D;} with the waveforms shown in the lower part of FIG. 8 and an upper half of FIG. 9. This example means that the character '0' specifies a falling edge at 100 ns, a falling edge at 200 ns and a falling edge at 400 ns wherein the last two edges are redundant and will not actually be retained. The character '1' specifies a falling edge at 100 ns, a rising edge at 200 ns and a falling edge at 400 ns.

The pattern character "0" can be matched by a NRZ or RZ waveform. The pattern character "1" would require a more complex waveform, such as the XOR (exclusive OR) with values T3=100 ns, T1=200 ns, T2=400 ns. There are several reasons why this is an undesirable situation. First, if these two characters are actually used in a pattern block (and their definition makes this likely), this will result in an on-the-fly wavekind switch. On many ATE systems, this results in a limiting of available resources. Also, on some systems, the use of the XOR waveform in certain situations can result in a reduction in tester resources. Clearly this is not desirable solution to this waveform matching problem. Thus, in the following, some tricks will be detailed that can be used to simplify complex match cases.

Unused Initial Value

In STIL, all of the information about the waveforms that will be used is presented up front in the WaveformTable construct. Analysis can be performed on this information to determine characteristics of the available wave shapes. This information can be used to make informed optimization. In this section, the concept of "unused initial value" is examined to see how this can help with optimization.

First, it should be noted that a set of pattern characters presented to a given signal defines a continuous waveform despite the use of the discrete characters. Consequently, the starting state experienced by a given character is based on the ending state produced by the previous character. The set of ending value is, therefore, contained within the information in the WaveformTables. The exception to this statement is the signal starting value, which can be set arbitrarily by the user. In order to allow optimization of the template matching algorithm, it is imperative that the user make intelligent choices about starting value.

Referring back to the example shown above, and repeated here: 01 {'100 ns' D; '200 ns' D/U; '400 ns' D;}, and the corresponding waveforms are shown in FIGS. 8 and 9. It has been already shown that a complete treatment of this set of characters results in undesirable consequences. In analyzing this set of characters, it is known that neither of them ends with a "U" (rising) value. Consequently, by initializing the signal with a "D" (falling) value, and these are the only available characters, the characters never begin any cycle in a "U" state. The waveform description shown in the lower left of FIG. 9 reduces (almost) to that shown in the lower right of FIG. 9. Thus, the simple RZ waveform (T1=200 ns; T2=400 ns) can be used to match this set of characters.

Table Based Analysis

Figure 12:
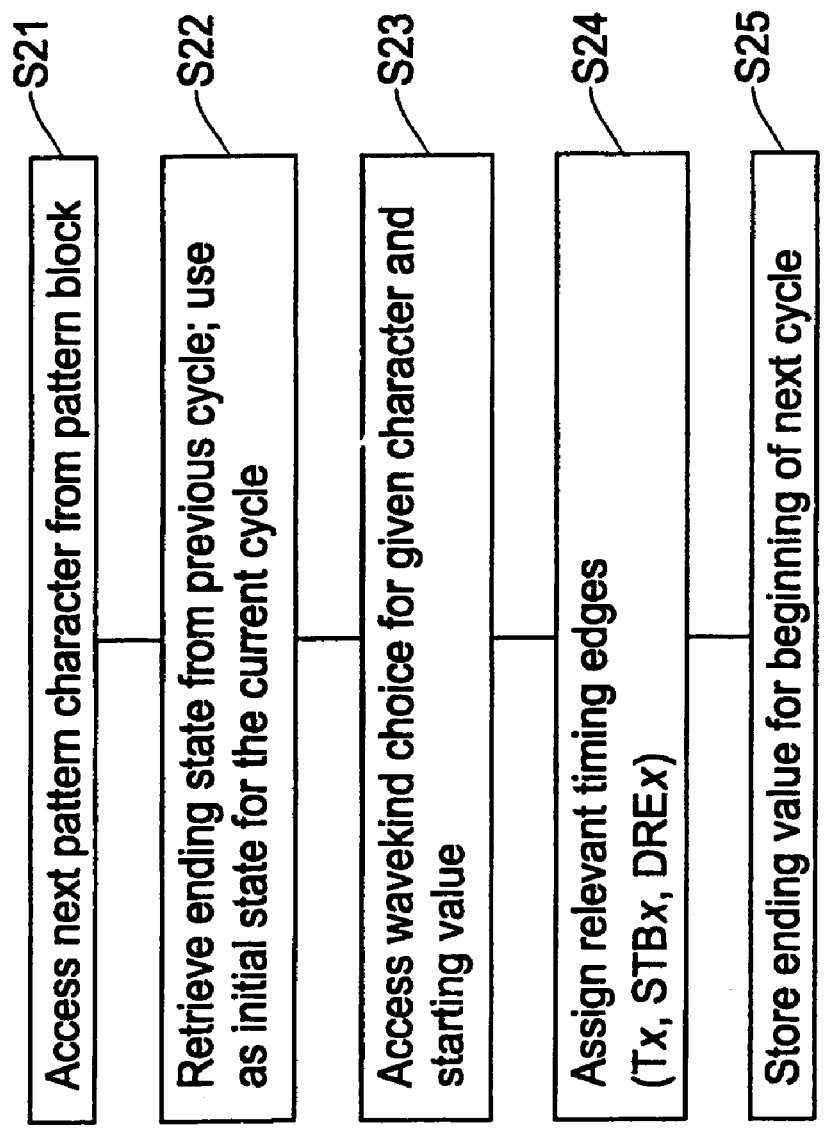
FIG. 12 is a flow diagram showing an example of procedure in the wavekind matching of the present invention from the previous cycle to the next cycle.

With the concept of unused initial value, the mechanism of WaveformTable-based analysis of the STIL characters is described with reference to the tables of FIGS. 10A and 10B and charts of FIGS. 11 and 12. This entails cataloging the requirements of all pattern characters and forming composite representations of these data at several levels (S11 in FIG. 11). Note that these data need not be compiled across all pins or pin groups, but only within a signal. For each signal, the wave shape requirement data are compiled at three levels (S12 in FIG. 11):

1. Entire signal
2. WaveformTable, and
3. Individual pattern character.

Ideally, it would be desirable to characterize the behavior of an entire signal using a single wavekind, so the data are compiled at this level. Failing this, the next logical level is the WaveformTable. It is assumed that switching WaveformTables will not happen often during the patterns, very possibly only in going from one pattern block to another. Furthermore, if the switching between pattern blocks occurs at the level of PatternExec blocks, these will be relegated to different tests in the TDL code and any differences in wavekinds will not result in an on-the-fly switch.

Finally, if the behaviors of the pattern characters within a WaveformTable cannot be represented by a single wavekind, the matching will be attempted on an individual character level. If this fails, it means that some pattern character in the STIL file contains requirements that cannot be satisfied by the test language of the target ATE system. In some cases, more advanced features of the target ATE system can be used to alleviate these problems. In other cases, this is simply reported as a fatal error in the conversion process.

The data to be stored at each of the levels indicated above is the same: the starting value and number of edges required by the STIL pattern characters. This is stored in an array whose dimensions are based on characteristics of the target ATE system. With use of the "unused initial value" technique described above, the capacity of array can be significantly reduced. The number of drive edges that can be supported per time set is read in at run time and this is used for one dimension of the array. The other dimension is two, the number of possible starting values "1" or "0" in a binary logic system. Each combination of starting value and number of edges that requires support is set to true (T). The rest are false (F).

Thus, for the above example:

0{ }1{'200 ns' U; '400 ns' D;}=>RZO; T1=200 ns; T2=400 ns the array would look like the table shown in FIG. 10A where it is assumed that at most four drive edges may be supported per time set. For another example:

23{'100 ns' D; '200 ns' D/U; '400 ns' D;} the table of FIG. 10B now contains an additional entry. This table describes all of the information about these four waveform characters. The technique of the unused initial value noted above can be applied to this table because "1" is the initial value that will never occur (unless set during initialization). As a result, the entire column labeled "1" can be set to false, which results in the same situation as described previously with reference to the waveforms in the lower left and right of FIG. 9. This mechanism can be applied to tables created at any of the levels, i.e, signal, waveform table, and pattern character, discussed.

The more detailed description regarding the template matching procedure is given here. As described above, the array (matcharray) of decomposed events each forming a starting value and number of edges is created in the event file 24 of FIG. 6B to be compared with the counterpart waveform data in the template file 25. Once the "matcharray" described above has been created, and then reduced through the analysis of "unused initial values", the match against the available waveforms is made (S13 in FIG. 11). As discussed above, the waveforms available to the target ATE system (read in at run time) are stored based on the starting value and number of edges they can support in the template file 25. The structure in the templates is analogous to the matcharray shown above except that the entry in each box of tables in FIGS. 10A and 10B is a collection of wavekind object pointers that can satisfy the indicated combination of starting value and number of edges.

It should be noted that a given wavekind will appear in several of these lists as they can support a variety of {starting value, number of edge} pairs. For example, the RZO waveform would be found in the {0,0}, {0,2}, {1,0} and {1,1} array elements as it can support all of these combinations. Note that this refers to the RZO waveform in TDL where there is no activity for the pattern character '0'. Thus, the {1,0} combination exists. The industry standard RZ waveform would return to zero for both pattern characters '0' and '1', and the {1,0} combination would not be possible.

The wavekind object can be queried for all combinations that it can support. For example, for accessing the RZO object through the {0,0} entry, the matching process can simply ask the RZO object about other combinations "can you support {0,2}" which would return true, "can you support {1,2}" which would return false. Thus, the matching process would find the object via the numerically lowest {starting value, number of edge} pair that was required and then query the object for the rest of the desired states. If any of these queries fail, this wavekind will not work and the matching process goes to the next entry in the original list and try the process again.

Once a successful match has been made for a given wavekind, the values for parameters must be set (S14 in FIG. 11). The decomposed STIL characters contain time values for transitions, and the wavekind objects contain strings for the names of their relevant resources. For the case of the RZO waveform, the match of the {0,2} case completes with the association of the time value 200 ns with the string "T1", and 400 ns with string "T2". These pairings are stored in a table corresponding to the STIL character '1' as defined in the WaveformTable.

The WaveformTable-based analysis method takes advantage of economies available when the source format is cycle-based. The information regarding the formats that will be used for the entire process is available up-front and can be processed, analyzed and optimized before pattern conversion begins. Once this has been completed, the processing of the vectors becomes very simple. The STIL pattern character is accessed (S21 in FIG. 12), the previous signal value (stored at the end of the previous cycle) is recalled (S22 in FIG. 12) and these data are used to access the information stored for the {starting value, STIL pattern character} pair, i.e. the wavekind and parameter information determined from the matching process (S23 and S24 in FIG. 12). Then, the ending value is stored for beginning of the next cycle (S25 in FIG. 12).

This is markedly different from the situation where the source format is event-based, for example, VCD (Value Change Dump) data by Verilog. In this case, the wave format information is usually not available up front. Matching of source data to target wave shapes must be done as the vectors are processed. This can lead to poor choices that are avoided using proper table analysis techniques.

Assuming the following two cycles in a waveform: If the template matching were done on a cycle-by-cycle basis (as would be the normal case without a table-based analysis), the first cycle would likely end up being mapped to NRZ; this is the simplest waveform that can satisfy the constraints. The second cycle is clearly RZO. If it were known about the second cycle when processing the first, it would have noted that the first cycle can also be mapped to RZO, and would have prevented an on-the-fly wavekind switch. A table-based analysis approach provides just this capability.

Output Signal Conversion

The preceding description has focused on the mapping of input STIL characters to TDL equivalents. The "input" here means a test pattern supplied (drive) to a pin of device under test (DUT). As previously noted, the test vectors include the test patterns (input) and strobes (output or compare). A strobe is a timing pulse either with edge (no pulse width) or window (predetermined pulse width) to sample the device output signal. Here, the output mapping strategies are described which deals with conversion of strobe signals (compare) in the STIL format to the TDL format. The behaviors specified in the STIL file can be directly translated to pattern characters. For example:

LHZX{'0 ns' Z; '0 ns' X; '260 ns' L/H/T/X;} can be mapped directly to edge strobes for the appropriate value, if all are applicable. In other words, the template matching is unnecessary in this process. Similarly:

LHZX{'0 ns' Z; '0 ns' X; '260 ns' l/h/t/x; '500 ns' x} can be mapped to the appropriate window strobe.

There are several points worth noting about the output conversion. The first is that some ATE may not allow switching of strobe type on-the-fly. Thus, edge and window strobes may not be mixed. A solution in this case is to make all strobes into window strobes, with edge strobes made into window strobes as narrow as allowed by the system. The second point is that STIL pattern characters that request multiple strobes within a cycle may or may not be compatible with the target ATE system. The capabilities of the ATE system family is built into the conversion tool with a resource file read at run time to indicate which subset of these features is actually present on a given target ATE system. This would include behaviors such as transition and double strobe modes.

Bidirectional Signal Conversion

Bidirectional signal conversion provides the most complexity in the entire process. Here, the term "bidirectional" means conversion of test language from the STIL formate to the native language format for the test vectors assigned to device pin which functions both input and output. All of the features required for input and output matching noted above are present as well as additional features unique to bidirectional signals. In addition, bidirectional signals often place limitations on tester resources above and beyond those placed by simple input or output signals. As an example, the number of available edges may be reduced due to the need for driver control signals to determine the directional state of the bidirectional signal.

The considerations for driver control are based on the characteristics of the STIL pattern characters and the capabilities of the target ATE system. A standard paradigm is to provide two driver enable modes, one that mimics the NRZ behavior, and one for RZ. In the former case, the cycle becomes "drive" (input) at some point and remains that way through the end of the cycle. For the RZ, the cycle becomes "drive" and then "compare" (output) during the cycle. Note that the cycle being in "compare" mode does not mean that a comparison is actually taking place, just that the pin is to be treated as an output. This distinction becomes important with regard to target ATE capabilities for drive and compare in a cycle.

The driver enable mode is determined from the STIL pattern characteristics by noting that an NRZ driver enable mode is preferred since it requires fewer tester resources. This mode is chosen unless specifically required to use the RZ mode. This only happens when a "drive" region is surrounded by "compare" regions in the same cycle. Again, actual comparisons may not be occurring, but the device pin is acting as an output. The time values for the driver control edges are determined from the transition times for the signal direction.

The inclusion of driver type information makes the "matcharray" process described above quite a bit more complex. The drive portions of the signal are matched against the available waveforms while the overall character of a cycle, in terms of "drive" and "compare" portions are compared against the capabilities of the target ATE system.

STIL contains the concept of the "DrivePrior" event. This is meant to contain the most-recently-used drive value on a system. For input signals, the prior drive value is always the last state of the signal, so this need not be considered. Output signals have no drive states, so this is irrelevant. Thus, the DrivePrior is only relevant for bidirectional signals where it represents the last drive state attained by the signal, regardless of any intervening strobe activity. On some ATE systems, the presence of a strobe character affects the state of the driver in the system. For example, if the last "drive" state is "D", and this is followed by a strobe for "H", the driver can be set to a "U" state for the next drive cycle. The "DrivePrior" is intended to handle this case. With regard to the conversion process, this prior state must be kept as well as the actual current state of the driver. The result of this is that the "matcharray" shown above contains four columns instead of two, corresponding to all possible pairs {previous value, DrivePrior}, i.e., the column heads (FIGS. 10A and 10B) are {0,0}, {0,1}, {1,0}, {1,1}.

The data used in these entries must be used properly in order for the concept of the "DrivePrior" to work properly. The desired initial state, as given by the "DrivePrior" value, must be reconciled with the actual state of the driver, previous value. Using the example above, the driver is in the "U" state, and the STIL pattern character is requesting the device to be in the "D" state based on the inclusion of the "DrivePrior" or "P" event in the description. The waveform chosen to match this pattern character must be able to reconcile these values, driving the pin from the "U" state to the "D" state by the time required. This can result in an additional edge not readily apparent from the STIL pattern character description.

Special Features

In the following, the test language conversion is further discussed as to the processing of special features provided in the target ATE system. These features represent those found on the assignee's ATE system, Advantest Model T6600 IC tester family, but they are quite general and may be found, in some form, on a variety of test systems. Thus, brief discussion is made as to the algorithms used to map the STIL information to these features.

Multi-Clock Signals

The multi-clock (MCLK) signal type is commonly used for providing more pulses per cycle thin the ATE system can theoretically provide. This is done for repetitive waveforms by essentially breaking the tester cycle into a series of subcycles (internally) and providing multiple copies of a basic waveform, one per subcycle. The result is the appearance of a greater number of edges than possible in the rated test cycle.

Figure 13:
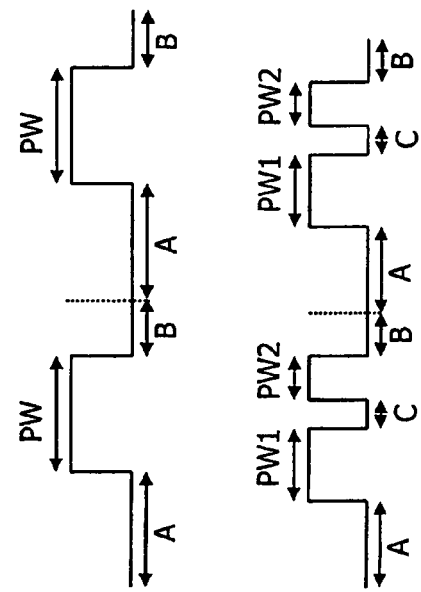
FIG. 13 is a diagram showing a basic idea of converting the STIL test vectors to multi-clock test signals of TDL when types of DUT pin are appropriate to such multi-clock signals.

The key to the use of the MCLK paradigm is that the waveform must contain a basic repeatable unit within the cycle. During the template matching algorithm described above, the discovery that a STIL pattern character contains too many edges leads to an attempt to match the character using an MCLK format. For this to work, the number of edges must be even (the MCLK format is pulse-based). The constraints that must be satisfied for a single-pulse repeatable waveform are derived with regard to an upper waveform of FIG. 13.

In order to have a repeatable unit, it is required that the widths of all pulses be the same. Furthermore, the spacing between the pulses must be equal to the sum of the space (A) before the first pulse plus the space (B) at the end of the last pulse, as shown. This means that it is necessary to have a basic repeatable unit that looks like RZ with T1=A, T2=A+PW, and a subcycle length of A+PW+B. If any of these conditions are not met it is unable to provide a single pulse basic repeatable unit.

It is possible to create a double-pulse basic repeatable unit. The requirements are derived based on the lower waveform of FIG. 13. In this case there are two pulses per repeatable block, and it requires that the corresponding pulses be the same width, in this case the pulses labeled PW1 and PW2. The sum of the begin and end space must match the interval between the repeatable unit repetitions, as above (repeatable unit space=A+B). Also, the spacing (C) between the pulses must be the same for all repeatable units. Thus, in this case, a subcycle length is A+PW1+C+PW2+B.

Pin Multiplexing

In the pin multiplexing (PMUX), two tester channels are combined to drive a single pin. This allows the resources for both tester channels to be used for the same signal, enabling drive (input) and compare (output) in the same cycle on ATE systems where this might not otherwise be available.

While the use of PMUX can make the ATE programming task easier, it adds complication to the conversion process by providing an additional degree of freedom. While this might seem desirable in that it provides flexibility, it makes the search of the wavekind space a little harder because requirements are not precisely pinned down. In the following, discussion will be made as to the implications of PMUX on the various pin types.

(1) Input PMUX

Input pin mapping is performed by a search of the wavekind space attempting to match the capabilities of the wavekind with the requirements of the STIL pattern character. The details of this approach have been discussed above. When an input signal is used with PMUX, the responsibility for matching the requirements of the STIL pattern character is shared between the two tester channels. The issue presented by the added flexibility is one of determining a "requirement sharing" methodology.

One approach taken is that the simplest sharing algorithm is not to share at all. If possible, one pin does all the work and the other does none. To this end, an attempt is made to map all of the edges specified by the STIL pattern character into the first tester channel. The matching that takes place here is identical to that described above for non-PMUX input signals. The difference occurs if the match attempt fails, i.e. there is no wavekind that can satisfy some subset of a STIL pattern character's requirements. Previously, this situation either resulted in an attempt to use MCLK, or the reporting of an error. With the PMUX case, one edge is shifted from the first channel to the second, and the match is attempted for the first channel and second channel separately. The shifting of edges is continued until a match is possible for both channels for all sets of requirements for the STIL pattern character.

Adding to the complication for this algorithm is the need to maintain continuity between the two component channel behaviors. A given channel "remembers" its final state from the last cycle. The state of the driver to the device, however, has been set by the signals from the other channel. For example, if channel 1 drives the pin to an "H" state, it will have "H" as its previous state. Now, suppose channel 2 drives the pin to a "L" state. When channel 1 drives again, it will "remember" being in the "H" state, but the driver will actually be in the "L" state because of the action of channel 2. Coordination between the two channels comprising the signal is required to prevent this situation.

As an example, consider the following signal of the uppermost waveform in FIG. 14, where $T_0$ denotes a cycle boundary. This signal is very simple and appears to have a NRZ character for the first signal. In fact, the second signal apparently needs to do nothing except stay low. Consider the first pass solution to this problem, shown in FIG. 14.

The signal proposed for Channel (Pin) 1 provides the rising edge at $T_a$, as desired (second waveform from the top in FIG. 14). Since there are no edges in the second portion of the signal, Pin 2 need have no edges (third waveform from the top in FIG. 14). In the second cycle, Pin 1 remains high as there are no edges. In the second part of the cycle, there is a low-going edge. Since Pin 2 is already in the "L" state, no edge will be generated.

It is clear from this example that the simple approach will not work in this case. The signal will look exactly like the waveform on Pin 1 as Pin 2 has no edges. This has happened because the continuity across channels has not been maintained. Pin 2 needs to be aware that Pin 1 has ended in an "H" state so that subsequent edges on the system, in this case the transition to "L" at $T_a$ in the second cycle, will be handled properly. This can be accomplished by replacing the waveform for Pin 2 above with that shown in the bottom of FIG. 15.

Here the waveform for Pin 2 is brought to the "H" state at the split time. This will have no effect on the composite signal as the driver is already in the "H" state due to the action of Pin 1. It does, however, condition Pin 2 to be in a consistent state with Pin 1. When the low-going edge happens in the second cycle during the Pin 2 portion this will result in a low-going transition on Pin 2 at $T_b$ as desired. This demonstrates the channel consistency problem that must be handled for PMUX signals.

(2) Output PMUX

As with normal pattern matching, the conversion of output signals in the presence of PMUX is simpler than input conversion. The cycle is split into two portions, and strobe edges are assigned to the two channels (pins) based on their position relative to the split time. For simplicity, the split time is chosen as the middle of the period. Strobe edges occurring before this time are assigned to the first channel, and those occurring after are assigned to the second. One notable exception to this rule is window strobes. These may not be split across the boundary between channels. Consequently, the split time is chosen so that the entire window strobe falls within one of the channels.

(3) Bidirectional PMUX

The use of PMUX with bidirectional signals allows features that might not otherwise be available. This is a primary use for the PMUX construct, rather than for pure input or output signals. Probably the single most important use of the PMUX is to allow drive and compare within a cycle, if the target ATE system does not allow this. For cases where a STIL pattern character for a bidirectional signal specifies pure drive or compare behavior for a cycle, the processing is virtually identical to that described with respect to the input and output pin multiplexing above. When the behavior is mixed, the split time for dividing the cycle between the channels is based on the time of the direction switch. This leads to a very natural division of the responsibilities of the two channels. The concept of continuity across channels that we discussed for input signals applies here as well, but must also take into account the effects of intervening strobes.

As has been described above, according to the present invention, the test vectors in an original test language are converted to a target test language with high efficiency and high accuracy.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method of converting test vectors in an original cycle based test language into a target cycle based test language, comprising the following steps of:

reading available waveforms defined in the target test language and forming a set of templates depicting the waveforms where each template corresponds to a waveform of the target test language and includes data showing at least a starting value of a segment of waveform and a number of subsequent edges in the waveform;

reading the test vectors of the original test language and decomposing a waveform in the test vectors in the original test language into a set of constituent events where each event includes data showing at least a starting value and a number of subsequent edges of the waveform;

comparing the template derived from the waveform in the target test language and the set of constituent events derived from the original test language;

storing the waveform data in the target test language when a match is detected in the comparison step and retrieving corresponding parameters of the waveform in the test vectors of original test language and storing the parameters in combination with the matched waveform data;

repeating the above steps for all of the test waveforms in the original test language, thereby forming representation of the waveforms in the target test language;

wherein the step of comparing the template and the constituent event is made at different levels of abstraction determined in advance, in the order of a signal level, a wavekind level where the signal is configured by a plurality of wavekinds, and a character level where the wavekind is configured by a plurality of characters.

2. A method of converting test vectors as defined in claim 1, wherein the set of constituent events is stored in a table format having columns assigned to the data showing the number of subsequent edges and the starting value.

3. A method of converting test vectors as defined in claim 2, wherein the table storing the set of constituent events is optimized by studying the starting value of a particular event based on an ending state produced by the previous event, thereby simplifying the data in the table.

4. A method of converting test vectors as defined in claim 1, wherein the test vectors includes drive signals to be supplied to a device under test (DUT) as an input and strobe signals to sample an output of DUT for evaluation, wherein the drive signals in the original test language are converted to the target test language by comparing the template and the set of constituent events for detecting the match while the strobe signals in the original test language are directly translated to the target test language.

5. A method of converting test vectors as defined in claim 1, wherein the waveforms in the original test language are assigned where required by resource limitations to a plurality of subcycles of the target test language where the plurality of subcycles are created by multiplexing a test cycle clock in a test system which is operated by the target test language.

6. A method of converting test vectors as defined in claim 1, wherein the waveforms in the original test language are assigned to a plurality of test channels of the target test language where the plurality of test channels are multiplexed to be connected to a single pin of DUT in a manner configured by a test system which is operated by the target test language.

7. A method of converting test vectors in a STIL (Standard Test Interface Language) into a target cycle based test language, comprising the following steps of:

reading available waveforms defined in the target test language and forming a set of templates depicting the waveforms where each template corresponds to a waveform of the target test language and includes data showing at least a starting value of a segment of waveform and a number of subsequent edges in the waveform;

reading the test waveforms of the STIL format and decomposing a waveform in the test vectors in the STIL format into a set of constituent events where each constituent event includes data showing at least a starting value and a number of subsequent edges of the waveform;

comparing the template derived from the waveform in the target test language and the set of constituent events derived from the waveform in STIL;

storing the waveform data in the target test language when a match is detected in the comparison step and retrieving corresponding parameters of the waveform in the test vectors of STIL and storing the parameters in combination with the matched waveform data;

repeating the above steps for all of the test vectors in STIL, thereby forming a test vector file of the target test language;

wherein the step of comparing the template and the constituent event is made at different levels of abstraction determined in advance, in the order of a signal level, a wavekind level where the signal is configured by a plurality of wavekinds, and a character level where the wavekind is configured by a plurality of characters.

* * * * *